US006781181B2

(12) United States Patent
Heo et al.

(10) Patent No.: US 6,781,181 B2
(45) Date of Patent: Aug. 24, 2004

(54) LAYOUT OF A FOLDED BITLINE DRAM WITH A BORDERLESS BITLINE

(75) Inventors: Kuen-Chy Heo, Chiai Hsien (TW); Jeng-Ping Lin, Taoyuan Hsien (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/453,502

(22) Filed: Jun. 4, 2003

(65) Prior Publication Data

US 2003/0201481 A1 Oct. 30, 2003

Related U.S. Application Data

(62) Division of application No. 09/826,014, filed on Apr. 5, 2001, now abandoned.

(30) Foreign Application Priority Data

Jul. 13, 2000 (TW) .......................................... 89113956 A

(51) Int. Cl.[7] .............................................. H01L 27/108
(52) U.S. Cl. ......................... 257/301; 257/296; 257/302
(58) Field of Search ................................. 257/296, 297, 257/298, 299, 300, 301, 302, 303, 304, 305, 306, 307, 308, 309, 310, 311, 312, 313

(56) References Cited

U.S. PATENT DOCUMENTS

| 4,694,428 | A |   | 9/1987 | Matsumura et al. |
| 5,831,301 | A | * | 11/1998 | Horak et al. |
| 6,034,879 | A | * | 3/2000 | Min et al. |
| 6,339,239 | B1 | * | 1/2002 | Alsmeier et al. |

* cited by examiner

Primary Examiner—Nathan J. Flynn
Assistant Examiner—Kevin Quinto
(74) Attorney, Agent, or Firm—Birch, Stewart, Kolasch & Birch, LLP

(57) ABSTRACT

A DRAM cell with a vertical transistor and a deep trench capacitor. In the DRAM cell, a deep trench capacitor is disposed in a substrate; a gate is disposed over the deep trench capacitor; an ion doped layer is disposed between the gate and an upper electrode of the capacitor; an insulating layer is disposed between the gate and the ion doped layer; a gate insulating layer is disposed on a sidewall of the gate; a channel region is located beside the gate insulating layer in the substrate; a source is disposed on a sidewall of the ion doped layer and on one side of the vertical channel region; and a common drain is disposed on the other side of the vertical channel region. The DRAM cell can be applied to an open bitline DRAM, a folded bitline DRAM, and a folded bitline DRAM with bordless bitline contact window.

1 Claim, 10 Drawing Sheets

LAYOUT OF A FOLDED BITLINE DRAM WITH A BORDERLESS BITLINE

This application is a divisional of application Ser. No. 09/826,014, filed on Apr. 5, 2001 now abandoned, the entire contents of which are hereby incorporated by reference and for which priority is claimed under 35 U.S.C. § 120; and this application claims priority of Application No. 089113956 filed in Taiwan, R.O.C. on Jul. 13, 2000 under 35 U.S.C. § 119.

BACKGROUND OF THE INVENTION

1. Field of the Invention

The present invention relates to a dynamic random access memory (DRAM). In particular, the present invention relates to a DRAM with vertical transistors and deep trench capacitors.

2. Description of the Related Art

With the wide application of integrated circuits (ICs), several kinds of semiconductor devices with higher efficiency and lower cost are produced based on different objectives. DRAM is such an important semiconductor device in the information and electronics industry.

Most of the DRAMs nowadays have one transistor and one capacitor in one DRAM cell. The memory capacity of the DRAM has reached 64 megabits, and can even reach 256 megabits. Therefore, under the increasing of the integration it is needed to shrink the size of the memory cell and the transistor so as to manufacture the DRAM with higher memory capacity and higher processing speed. A 3-D capacitor structure itself can reduce its occupation area in the semiconductor substrate, so the 3-D capacitor, such as a deep trench capacitor, is applied to the fabrication of the DRAM of 64 megabits and above. Referring to a traditional plane transistor, it covers quite a few areas of the semiconductor substrate and cannot satisfy the request of high integration. Therefore, a vertical transistor which can save space is a trend of fabrication of a memory unit.

One of the most used DRAM cell array is an open bitline structure, in which each memory cell is arrayed with a matrix.

Another frequently used DRAM cell array is a folded bitline structure, as shown in FIG. 9. Each memory cell, using label 10 as an example, comprises a transistor 12, a storage capacitor 14, a bitline 22, a wordline 18 and a passing wordline 20. When an approproate voltage is applied to the bitline 22 and the wordline 18, data can be written into or read from the capacitor 14. When an output volage is applied to the memory cell 10 covering the connecting wordline 18 and the passing wordline 20, bitlines 22 and 24 are switched to differential sense amplifier.

FIG. 10 is a cross-sectional view of the memory cell 10 in FIG. 9. The wordline 18 is also used as a gate of the transistor 12. The passing wordline 20 is located over the thick oxide layer 36, and works no function for operation of the memory cell 10. The bitline 22 is connected to a source 40 of the transistor 12 through a contact window 38. A drain 42 of the transistor 12 is connected to the deep trench capacitor 44 through a buried strap 41.

However, such structure of the memory cell 10 has some challenges as described below. The outdiffusion of the dopants contained in the buried strap 41 may induce the short channel effect. Therefore, it is impossible to decrease the distance between the wordline 18 and deep trench capacitor 44 to increase the integration of the DRAM.

With the enhancement of the memory capacity, a DRAM with more compact transistors and deep trench capacitors is needed to satisfy the requirements of memory capacity.

SUMMARY OF THE INVENTION

An object of the present invention is to provide a DRAM cell array with a vertical transistor and a deep trench capacitor, so as to release the limitation from the wordline to deep trench to increase the integration of the DRAM.

Another object of the present invention is to provide an open bitline DRAM with a vertical transistor and a deep trench capacitor, so as to increase the integration of the DRAM.

Another object of the present invention is to provide a folded bitline DRAM with a vertical transistor and a deep trench capacitor, so as to increase the integration of the DRAM.

Another object of the present invention is to provide a folded DRAM with a vertical transistor, a deep trench capacitor and a borderless bitline contact window, so as to increase the integration of the DRAM.

The present invention provides a DRAM cell with a vertical transistor and a deep trench capacitor. In the DRAM cell, a deep trench capacitor comprising an upper electrode, an insulating film and a storage electrode is desposed in a substrate; a gate of the vertical transistor is disposed over the deep trench capacitor; an ion doped layer is disposed between the gate and the upper electrode of the capacitor; an insulating layer is disposed between the gate and the ion doped layer; a gate insulating layer of the vertical transistor is disposed on a sidewall of the gate; a channel region is located beside the gate insulating layer in the substrate; a source is disposed on a sidewall of the ion doped layer and on one side of the vertical channel region; and a common drain is disposed on the other side of the vertical channel region. Moreover, a shallow trench isolation is disposed on another sidewall of the ion doped layer.

The present invention provides an open bitline DRAM with straight wordlines, wherein each DRAM cell is as mentioned above, the deep trench capacitors are arranged in a matrix in the substrate.

The present invention provides an open bitline DRAM with zigzag wordlines, wherein each DRAM cell is as mentioned above. The deep trench capacitors belonging to different rows are arranged with a shift.

The present invention provides a folded DRAM, wherein each DRAM cell is as mentioned above.

The present invention provides a folded DRAM with borderless bitline contact window, wherein each DRAM cell is as mentioned above.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Detailed descriptions of DRAMs with vertical transistors and deep trench capacitors are given hereafter, by the accompanying four embodiments. The four embodiments include DRAM cell arrays with an open bitline and a folded bitline, a folded DRAM cell array, and a folded DRAM cell array with borderless bitline contact window.

First Embodiment: a DRAM Cell Array with an Open Bitline

Figure 1:
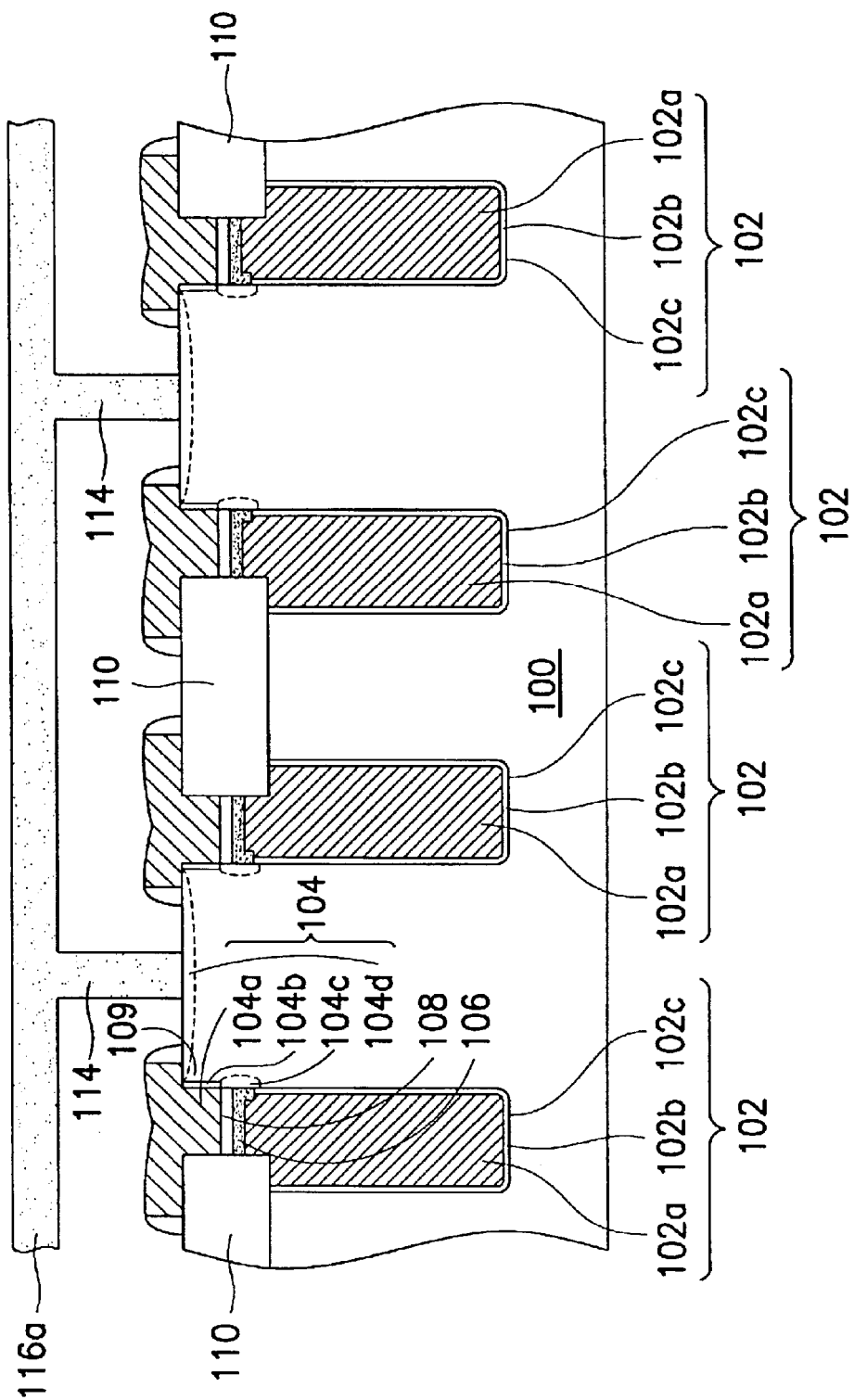
FIG. 1 is a cross-sectional diagram of a DRAM with a vertical transistor and a deep trench capacitor in accordance with first and second embodiments of the present invention.
Figure 2:
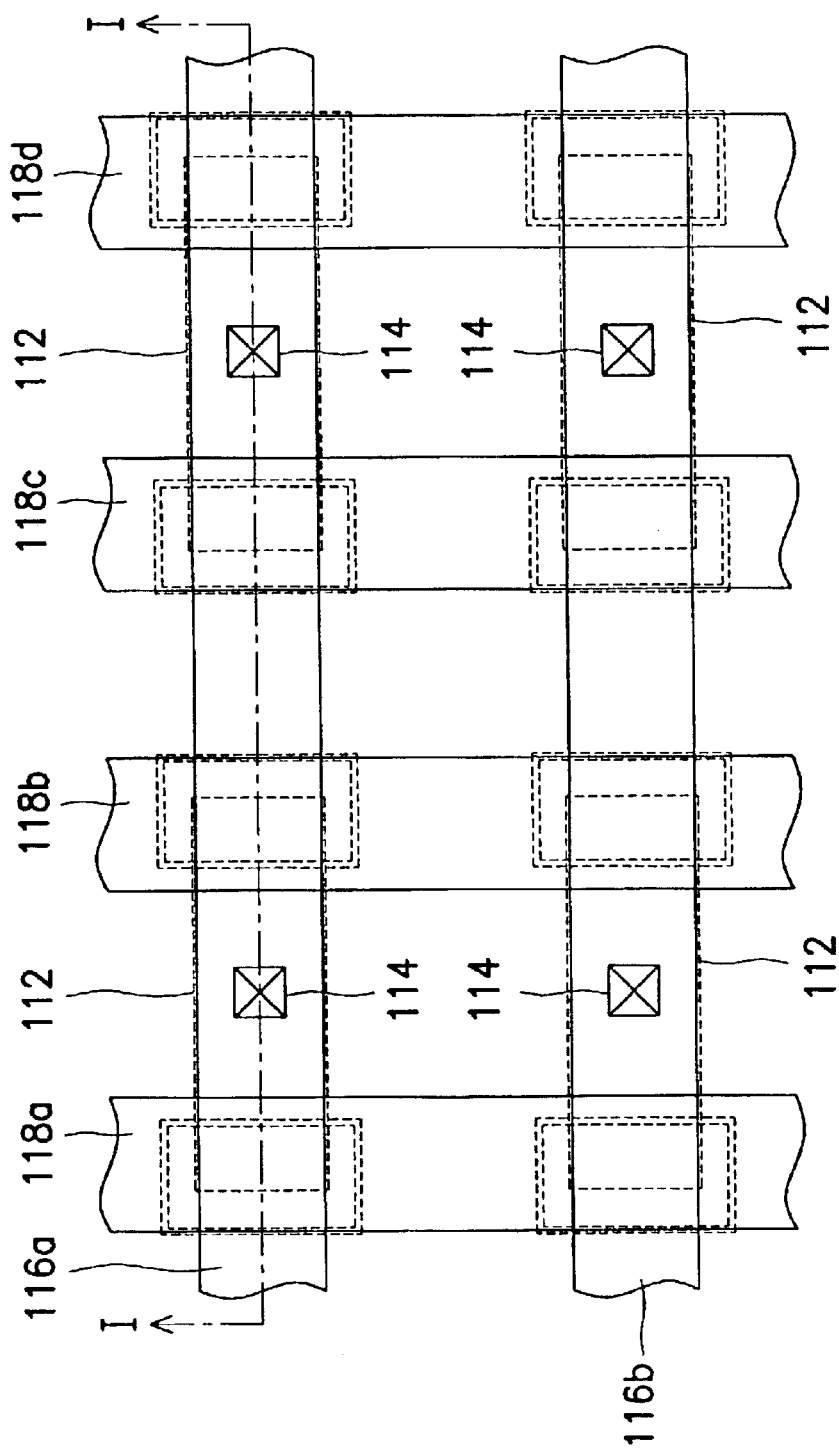
FIG. 2 is a layout diagram of an open bitline DRAM in accordance with the first embodiment of the present invention, wherein the cross-sectional view of the cutting line I—I is showed in FIG. 1.

FIG. 1 is a cross-sectional diagram of a DRAM with a vertical transistor and a deep trench capacitor of the present invention. FIG. 2 is a layout diagram of an open bitline DRAM in accordance with the first embodiment of the present invention, wherein the cross-sectional view of the cutting line I—I is showed in FIG. 1.

The deep trench capacitors 102 arranged in a matrix are formed in the substrate 100. Each of the deep trench capacitors 102 comprises an upper electrode 102a, an insulating film 102b and a storage electrode 102c. A vertical transistor 104 comprising a gate 104a, a gate insulating layer 104b, a source 104c and a common drain 104d is disposed over each deep trench capacitor 102. The gate 104a comprises an upper portion, which is not embedded in the substrate 100, and a lower portion, which is embedded in the substrate 100. The gate-insulating layer 104b is disposed on the sidewall of the lower portion of the gate 104a. A vertical region between the source 104c and the common drain 104d is a channel region 109.

An insulating layer 108 and an ion-doped layer 106 are disposed between the gate 104a and the upper electrode 102a of the capacitor 102. The source 104c is disposed on the sidewall of the ion-doped layer 106. A shallow trench isolation 110 is disposed at least on another sidewall of the ion doped layer 106. The insulating layer 108 is disposed between the gate 104a and the ion doped layer 106, so as to isolate the gate 104a and the ion doped layer 106 with each other.

Wordlines 118a, 118b, 118c and 118d are also functioned as gates 104a of the transistors 104. Moreover, two adjacent wordlines 118a and 118b, or 118c and 118d share a common drain 104d in an active region 112. The region outside the active region 112 is the shallow trench isolation 110. The bitlines 116a and 116b perpendicular to the wordline 118a, 118b, 118c and 118d are connected with the common drains 104d through contact windows 114 in different rows respectively.

Second Embodiment: a DRAM Cell Array with a Folded Bitline

Figure 3:
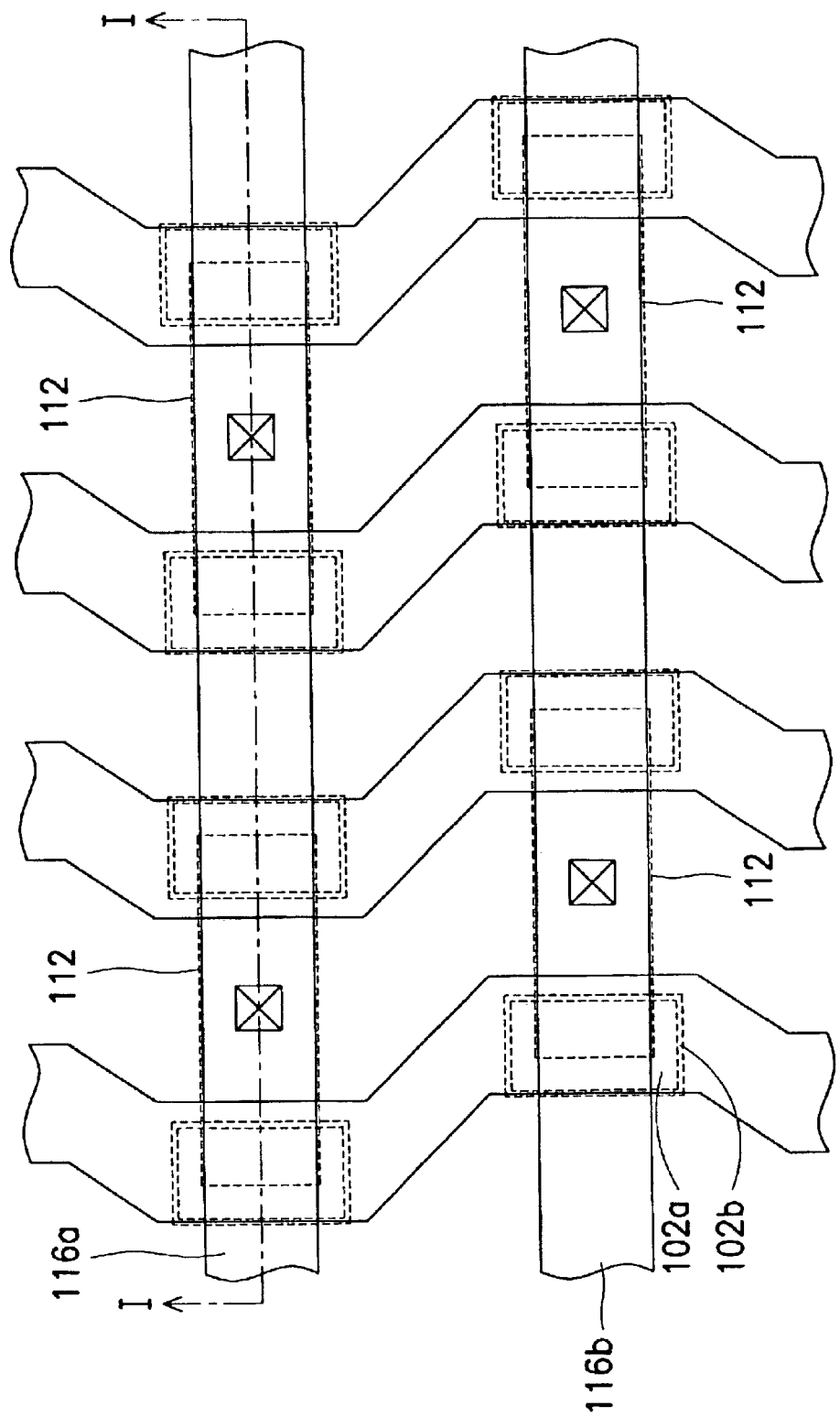
FIG. 3 is a layout diagram of another open bitline DRAM in accordance with the second embodiment of the present invention, wherein the cross-sectional view of the cutting line I—I is showed in FIG. 1.

FIG. 3 is a layout diagram of an open bitline DRAM in accordance with the second embodiment of the present invention, wherein the cross-sectional view of the cutting line I—I is as showed in FIG. 1.

The deep trench capacitors 102 substantially corresponding to the adjacent bitlines 116a and 116b are arranged with a shift. That is, the deep trench capacitor 102 corresponding to the bitline 116b is opposite to the common drain 104d corresponding to the bitline 116a. Under the above-mentioned layout, the isolation between the deep trench capacitor 102 corresponding to the bitline 116a and the deep trench capacitor 102 corresponding to the bitline 116b are enhanced. Moreover, the wordlines 118a, 118b, 118c and 118d run zigzag and are parallel with each other.

Third embodiment: a Folded DRAM Cell Array.

Figure 4:
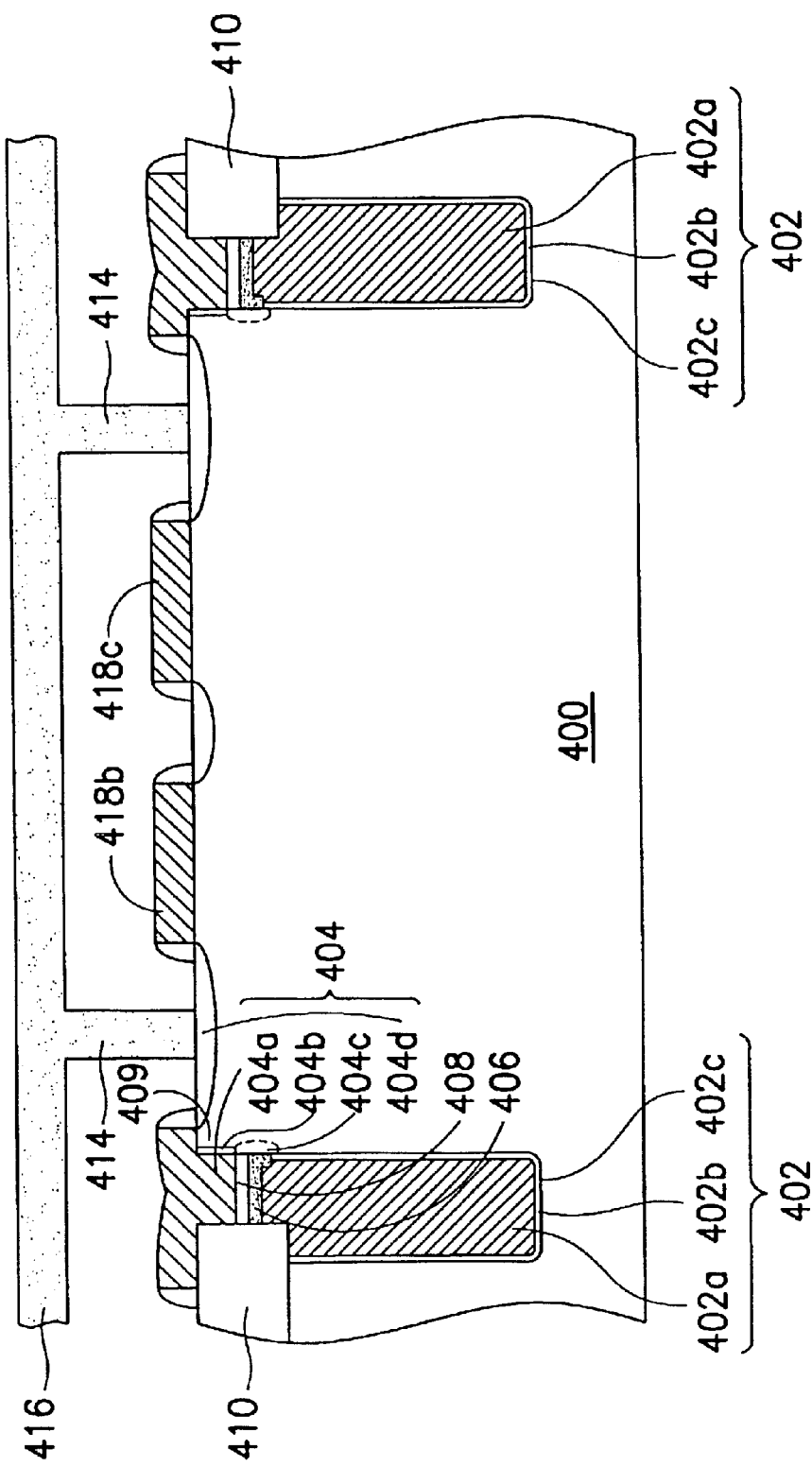
FIGS. 4 and 5 are cross-sectional diagrams of a DRAM with a vertical transistor and a deep trench capacitor in accordance with a third embodiment of the present invention.
Figure 5:
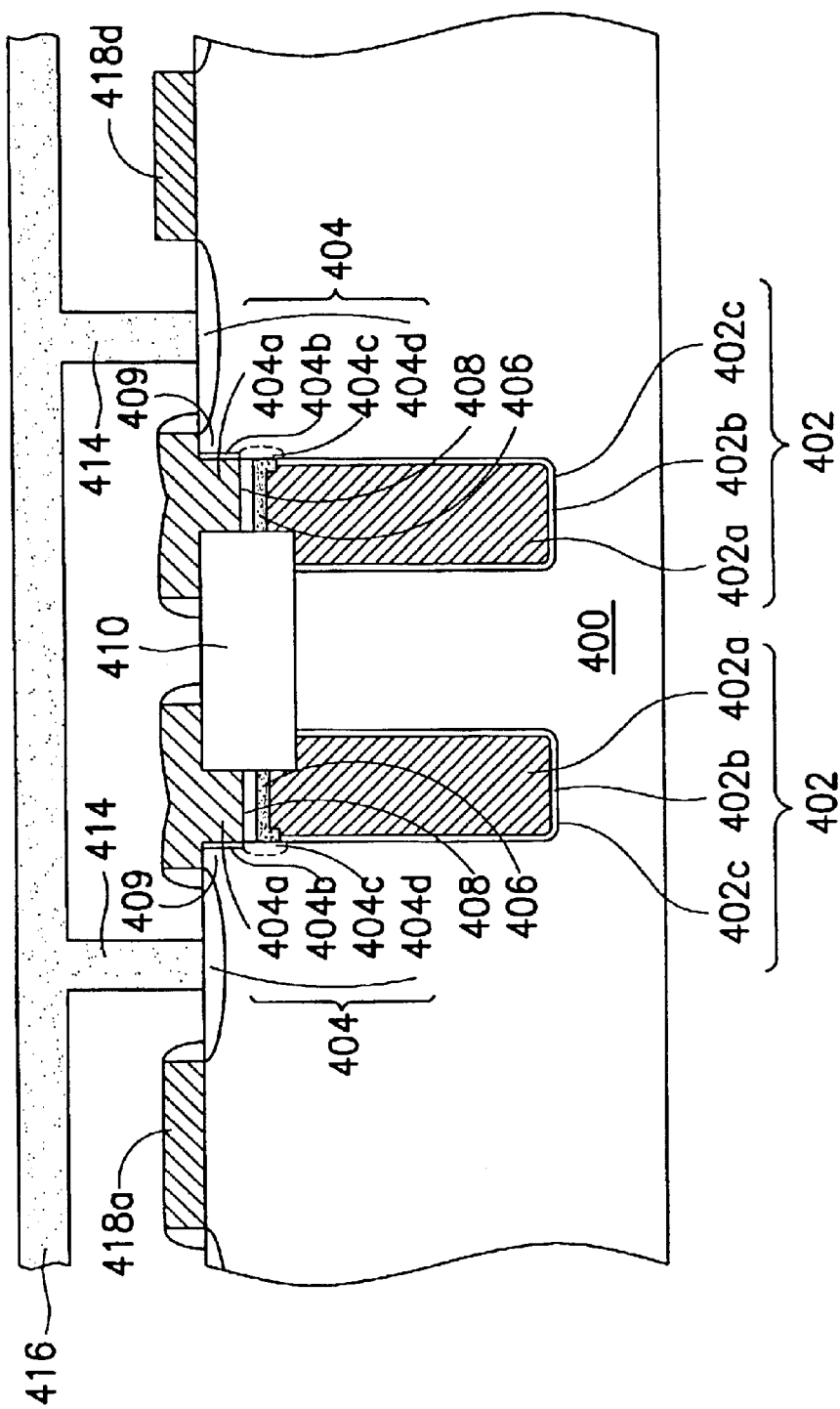
Figure 6:
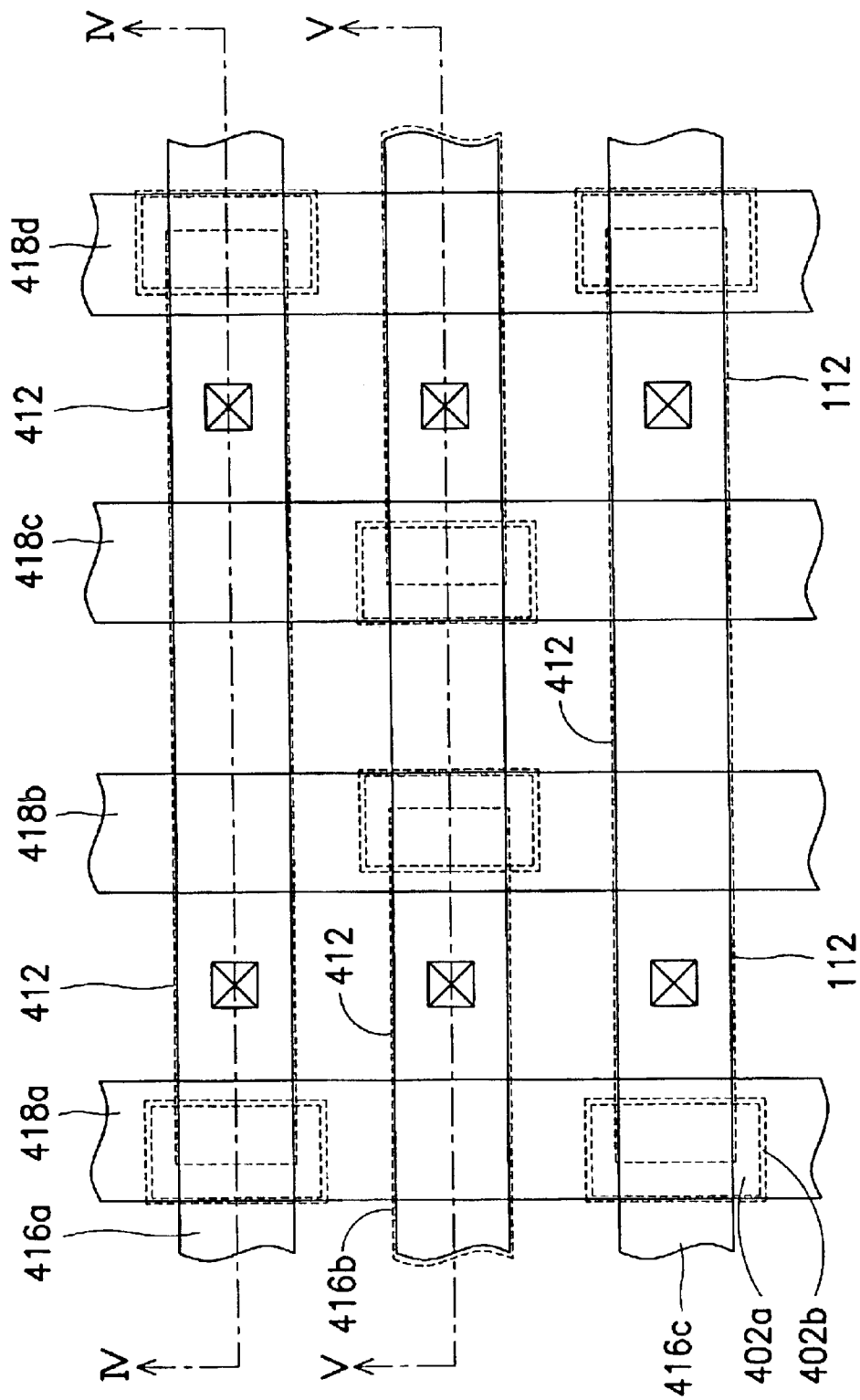
FIG. 6 is a layout diagram of a folded DRAM in accordance with the third embodiment of the present invention, wherein the cross-sectional view of the cutting line IV—IV is showed in FIG. 4, and the cross-sectional view of the cutting line V—V is showed in FIG. 5.

FIGS. 4 and 5 are cross-sectional diagrams of a DRAM with a vertical transistor and a deep trench capacitor. FIG. 6 is a layout diagram of a folded DRAM in accordance with the third embodiment of the present invention, wherein the cross-sectional view of the cutting line IV—IV is shown in FIG. 4, and the cross-sectional view of the cutting line V—V is shown in FIG. 5.

The structures of a deep trench capacitor 402 and a vertical transistor 404 are the same as the first and second embodiments substantially. The deep trench capacitor 402 comprises an upper electrode 402a, an insulating film 402b, and a storage electrode 402c. A vertical transistor 404 comprising a gate 404a, a gate insulating layer 404b, a source 404c and a common drain 404d is disposed over each deep trench capacitor 402. The gate-insulating layer 404b is disposed on a sidewall of the lower portion of the gate 404a. A vertical region between the source 404c and the common drain 404d is a channel region 409.

An insulating layer 408 and an ion-doped layer 406 are disposed between the gate 404a and the upper electrode 402a of the capacitor 402. The source 404c is disposed on the sidewall of the ion-doped layer 406. A shallow trench isolation 410 is disposed at least on another sidewall of the ion doped layer 406. The insulating layer 408 is disposed between the gate 404a and the ion doped layer 406 so as to isolate the gate 404a and the ion doped layer 406 with each other.

In this embodiment, each active region 412, such as corresponding to the bitline 416a, comprises two deep trench capacitors 402, two wordlines 418a and 418d corresponding to the two deep trench capacitors 402, and two passing wordlines 418b and 418c disposed between the two wordlines 418a and 418d. The wordlines 418a and 418d corresponding to the active region 412 below the bitline 416a are functioned as gates 404a of the transistors 404. The deep trench capacitors 402 are under the gates 404a. The region outside the active region 412 is the shallow trench isolation 410.

Furthermore, contact windows 414 are disposed between the gates 404a and the passing wordlines 418b and 418c and connected with the bitline 416. The bitline 416 is substantially parallel with the active region 412 and perpendicular with the wordlines 418a and 418d and the passing wordlines 418b and 418c.

Fourth embodiment: a Folded DRAM Cell Array with Borderless Bitline Contact Window.

Figure 7:
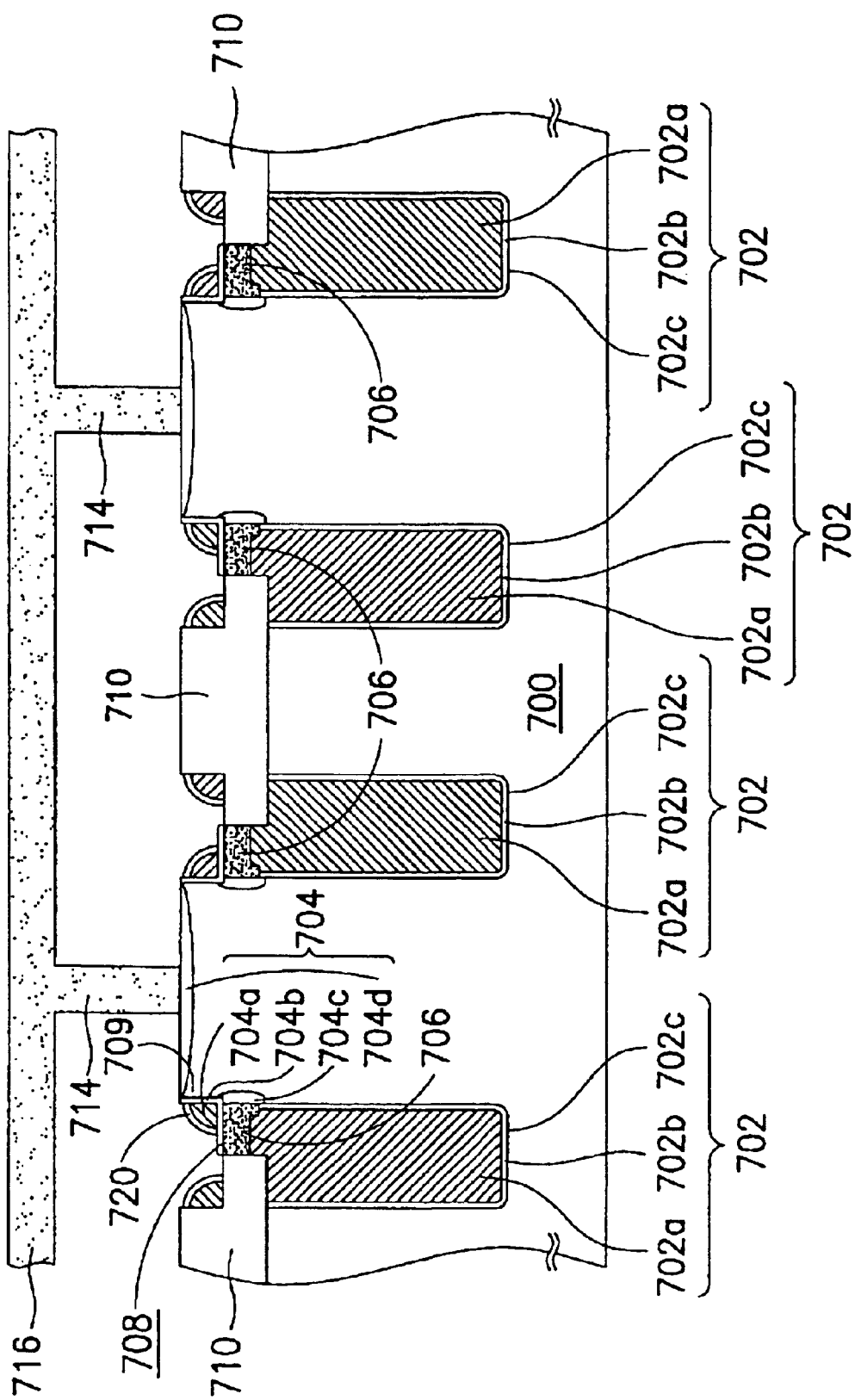
FIG. 7 is a cross-sectional diagram of a DRAM with a vertical transistor, a deep trench capacitor and a borderless bitline contact window in accordance with a fourth embodiment of the present invention.
Figure 8:
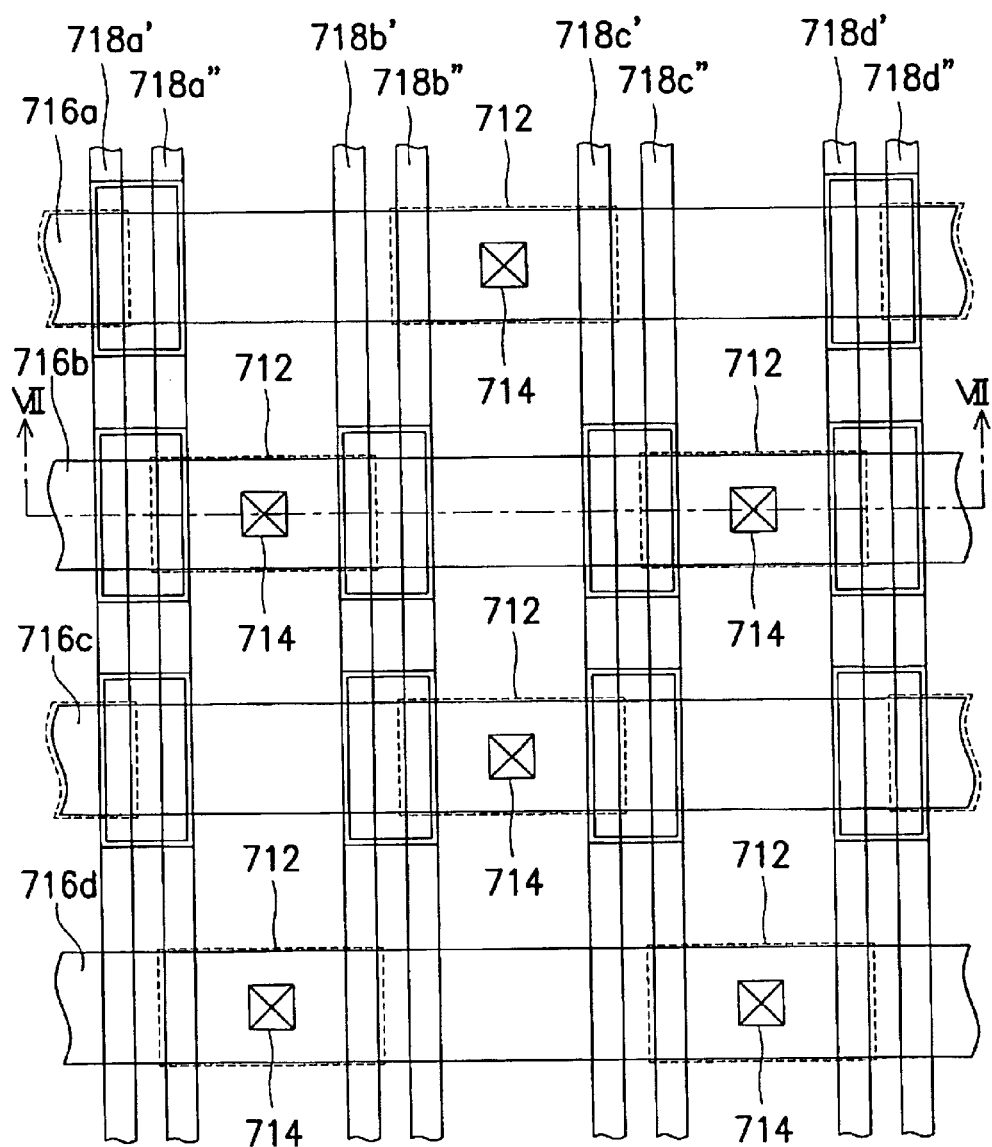
FIG. 8 is a layout diagram of a folded DRAM with a borderless bitline contact window in accordance with the fourth embodiment of the present invention, wherein the cross-sectional view of the cutting line VII—VII is showed in FIG. 7.
Figure 9:
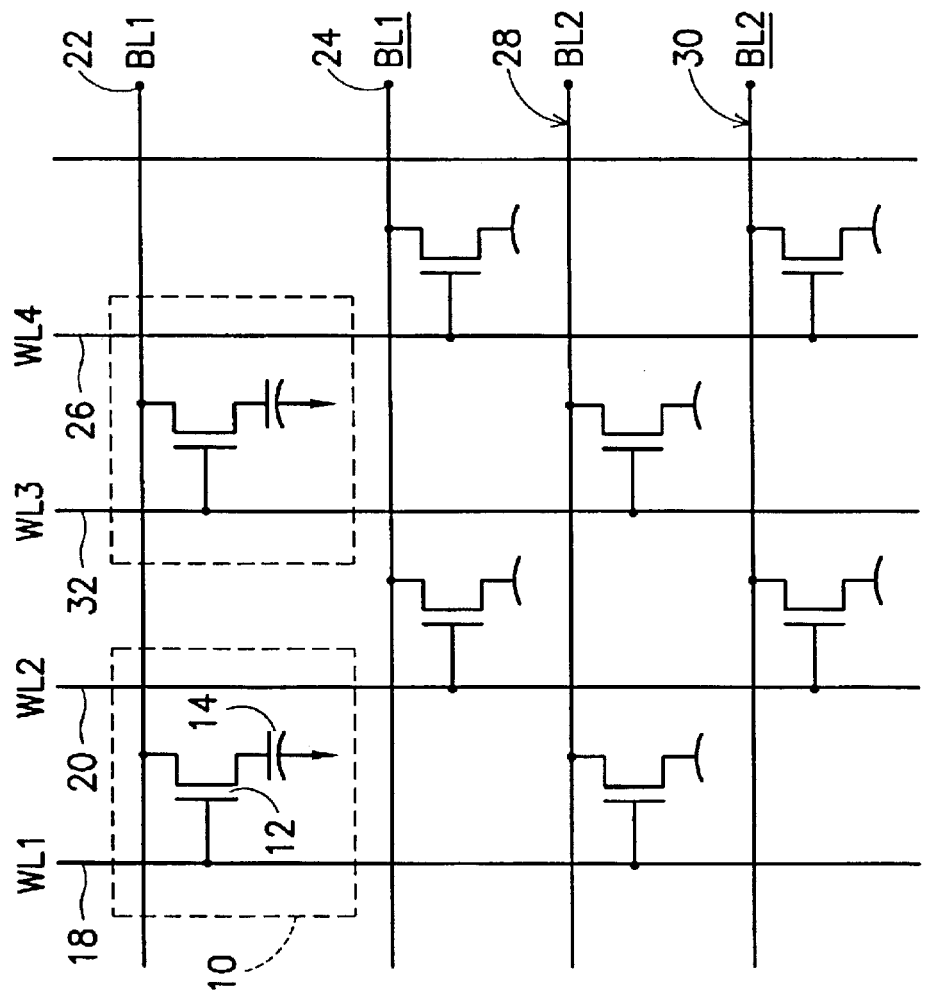
FIG. 9 is a layout diagram of a conventional and most used folded DRAM.
Figure 10:
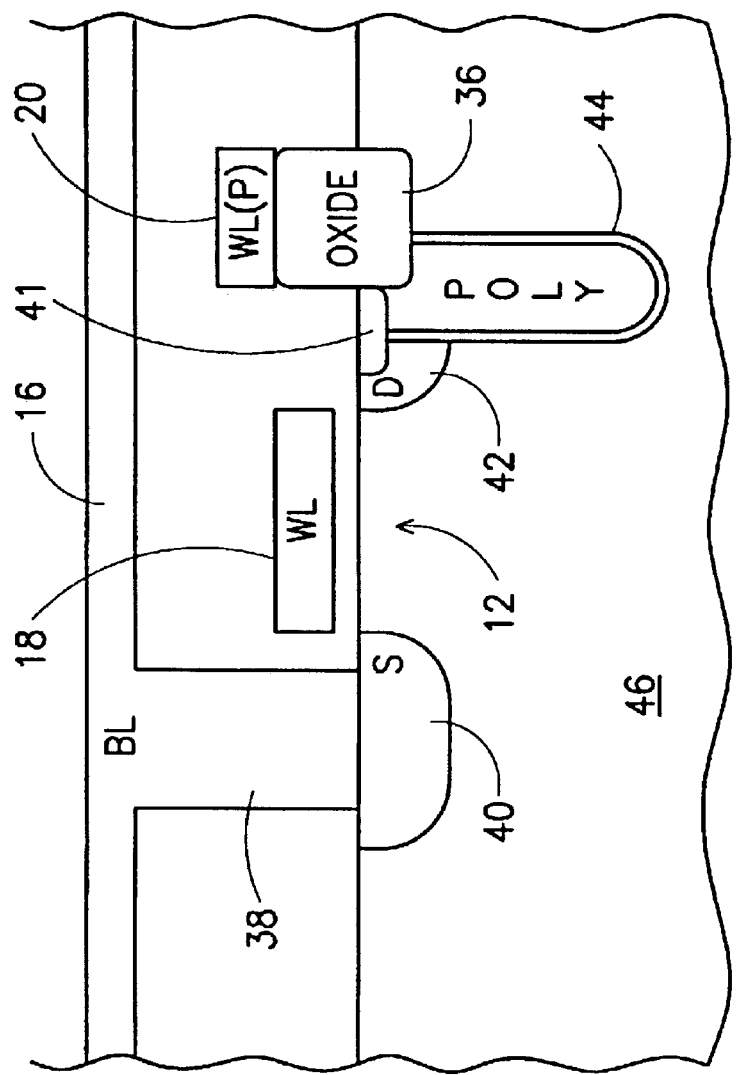
FIG. 10 is a cross-sectional view of the memory cell in FIG. 9.

FIG. 8 is a layout diagram of a folded DRAM with a borderless bitline contact window in accordance with the fourth embodiment of the present invention, and the cross-sectional view of the cutting line VII—VII is shown in FIG. 7.

The deep trench capacitors 702 arranged in rows and columns are formed in the substrate 700. The deep trench capacitors 702 belonging to different rows are arranged with a shift. Each of the deep trench capacitors 702 comprises an upper electrode 702a, an insulating film 702b and a storage electrode 702c. A vertical transistor 704 comprising a gate 704a, a gate insulating layer 704b, a source 704c and a common drain 704d is disposed over each deep trench capacitor 702. The gate-insulating layer 704b is disposed on a sidewall of the lower portion of the gate 704a. A vertical region between the source 704c and the common drain 704d is a channel region 709.

An insulating layer 708 and an ion-doped layer 706 are disposed between the gate 704a and the upper electrode 702a of the capacitor 702. The source 704c is disposed on the sidewall of the ion-doped layer 706. A shallow trench isolation 710 is disposed on at least one other sidewall of the ion doped layer 706. The insulating layer 708 is disposed between the gate 704a and the ion doped layer 706, so as to isolate the gate 704a and the ion doped layer 706 with each other.

The gate 704a and the passing wordline are disposed over each deep trench capacitor 702. A part of the shallow trench isolation 710 is expanded to cover a part of the deep trench capacitor 702, and the passing wordline is disposed on the part of the shallow trench isolation 710.

In this embodiment, each active region 712, such as corresponding to the bitline 716b and the wordlines 718a" and 718b', comprises two deep trench capacitor 702, two wordlines 718a" and 718b' corresponding to the two deep trench capacitors 702, and a common drain 704d between the wordlines 718a" and 718b'. Two passing wordlines 718a' and 718b" are disposed outside the two wordlines 718a" and 718b'. The wordlines 718a" and 718b' corresponding to the active region 712 below the bitline 716b are functioned as gates 704a of the transistors 704. The region outside the active region 712 is a shallow trench isolation 710.

Furthermore, the bitlines 716a, 716b, 716c and 716d are connected with the common drain 704d through contact windows 714. The bitlines 716 are perpendicular to the wordlines (or passing wordlines) 718a', 718a", 718b', 718b", 718c', 718c", 718d' and 718d". Because the surface of the wordlines (or passing wordlines) 718a', 718a", 718b', 718b", 718c', 718c", 718d' and 718d" are covered by the insulating layer 720, the contact window 714 cannot meet with the common drain 704d, even if misalignment happens in the photolithography process. Therefore, no short circuit happens.

Finally, while the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A layout of a folded bitline DRAM with a borderless bitline contact window, comprising:

a substrate;

a plurality of wordlines disposed on the substrate;

a plurality of deep trench capacitors disposed in the substrate, wherein the deep trench capacitors belonging to different rows are arranged with a shift, and two wordlines leap over each deep trench capacitor;

a plurality of bitlines disposed over the wordlines and perpendicular to the wordlines, wherein the deep trenches are directly located under intersection points of the wordlines and bitlines, and the deep trenches under the same bitline are arranged with a straight line;

each active region corresponding to the bitlines and comprising two wordlines which leap different deep trench capacitors and function as gates, wherein each two adjacent active regions corresponding to two adjacent bitlines are arranged with a shift;

an insulating layer disposed between each gate and each deep trench capacitor;

a common drain disposed between the two gates belonging to the two wordlines which leap over different deep trench capacitors, wherein the common drain does not overlap the gates;

a deep trench capacitor disposed below each gate;

a contact window located on the common drain to connect the common drain and bitline;

an ion doped layer disposed between each insulating layer and each deep trench capacitor;

a source disposed on a sidewall of each ion doped layer in the substrate;

a gate insulating layer disposed on a sidewall of a portion of each gate, wherein the source is located on one side of the gate insulating layer; and a shallow trench isolation disposed outside the active region.

* * * * *